United States Patent
Tao et al.

[11] Patent Number: 6,118,176
[45] Date of Patent: Sep. 12, 2000

[54] STACKED CHIP ASSEMBLY UTILIZING A LEAD FRAME

[75] Inventors: Su Tao, Kaohsiung; Kuang-Lin Lo; Kuang-Chun Chou, both of Kaohsiung Hsien; Shih-Chih Chen, Kaohsiung, all of Taiwan

[73] Assignee: Advanced Semiconductor Engineering, Inc., Kaohsiung, Taiwan

[21] Appl. No.: 09/298,848

[22] Filed: Apr. 26, 1999

[51] Int. Cl.[7] .................................................. H01L 23/495
[52] U.S. Cl. ........................ 257/676; 257/686; 257/692; 257/693; 257/777; 257/779; 257/784; 257/786; 361/790; 361/813
[58] Field of Search ...................................... 257/668, 686, 257/777, 779, 780, 784, 786, 790, 676, 685, 692, 693, 694; 174/52.2, 52.4; 361/728, 729, 730, 735, 790, 813

[56] References Cited

U.S. PATENT DOCUMENTS

| | | | |
|---|---|---|---|
| 4,763,188 | 8/1988 | Johnson | 357/74 |
| 5,331,205 | 7/1994 | Primeaux | 257/790 |
| 5,332,922 | 7/1994 | Oguchi et al. | 257/723 |
| 5,347,429 | 9/1994 | Kohno et al. | 361/813 |
| 5,471,369 | 11/1995 | Honda et al. | 361/813 |
| 5,483,024 | 1/1996 | Russell et al. | 174/524 |
| 5,530,292 | 6/1996 | Waki et al. | 257/724 |
| 5,561,329 | 10/1996 | Mine et al. | 257/788 |
| 5,646,829 | 7/1997 | Sota | 361/813 |
| 5,757,080 | 5/1998 | Sota | 257/777 |
| 5,793,108 | 8/1998 | Nakanishi et al. | 257/723 |
| 5,804,874 | 9/1998 | An et al. | 257/676 |
| 5,814,881 | 9/1998 | Alagaratnam et al. | 257/686 |
| 5,917,242 | 6/1999 | Ball | 257/737 |

FOREIGN PATENT DOCUMENTS

| | | |
|---|---|---|
| 56-62351 | 5/1981 | Japan . |
| 3-22544 | 1/1991 | Japan . |

*Primary Examiner*—John Guay
*Assistant Examiner*—Alonzo Chambliss
*Attorney, Agent, or Firm*—Dykema Gossett PLLC

[57] ABSTRACT

A stacked chip assembly generally includes a first chip, a second chip and a lead frame. The lower surface of the first chip is pasted onto the lower surface of the second chip by an adhesive film so as to form a stacked chip body. The stacked chip body is disposed on the lead frame. Bonding pads of the upper surface of the first chip are interconnected to the upper surface of the inner leads of the lead frame by bonding wires. Bonding pads of the upper surface of the second chip are interconnected to the lower surface of the inner leads of the lead frame by bonding wires. Therefore, the first chip and the second chip are simultaneously interconnected to an external circuit devices through the lead frame.

3 Claims, 3 Drawing Sheets

STACKED CHIP ASSEMBLY UTILIZING A LEAD FRAME

BACKGROUND OF THE INVENTION

1. Field of the Invention

The present invention generally relates to a stacked chip assembly, and more specifically, to a stacked chip assembly wherein two chips are stacked together on a lead frame.

2. Description of the Related Art

In a LOC (Lead-on-Chip) device, a die pad of a lead frame is not used. Instead, an inner lead portion of a lead frame extends over and attaches to an active surface of a semiconductor chip to be packaged. Then bonding pads of the chip are electrically interconnected to the corresponding inner lead portion. The LOC packaging technology provides a useful method for increasing the packaging efficiency of conventional package devices. Conventional stack package devices employ a three dimensional stacking technology comprising at least two chips within a single package. The stacked package device is suitable for use in increasing memory capacity of DRAM (Dynamic Random Access Memory) package devices.

FIG. 1 is a cross sectional view of a conventional LOC type stacked chip assembly disclosed in U.S. Pat. No. 5,332,922 issued on Jul. 26, 1994 to Oguchi et. al. The stacked chip assembly mainly includes a first chip 101, a second chip 102, a first lead frame 103, and a second lead frame 104. The first chip 101 is disposed on the lower surface of the first lead frame 103 and is electrically interconnected thereto by bonding wires 105. The second chip 102 is disposed on the lower surface of the second lead frame 104 and is electrically interconnected thereto by bonding wires 106. Then, the second lead frame 104 is inverted and bonded to the first lead frame 103 wherein the corresponding leads thereof are bonded by using a YAG (Yttrium Aluminum Garnet) laser beam. Then, the stacked chip assembly is encapsulated in a resin package 107. However, in this conventional stacked chip assembly, the bonding wires 105 and 106 must be spaced apart enough to prevent electrical shorts therebetween, and the first lead frame 103 and the second lead frame 104 are disposed between the first chip 101 and the second chip 102. These both act as limitations in reducing the thickness of the stacked chip assembly. Because the first chip 101 and the second chip 102 must be electrically connected to the first lead frame 103 and the second lead frame 104 respectively, the assembly process becomes complicated. Moreover, because the inner leads of the first lead frame 103 and the second lead frame 104 are bonded by using a YAG laser beam, the stacked package devices are manufactured at a higher cost.

FIG. 2 is a cross sectional view of another conventional LOC type stacked chip assembly disclosed in U.S. Pat. No. 5,804,874 issued on Sep. 8, 1998 to An et. al. The stacked chip assembly mainly includes a first chip 201, a second chip 202, a first lead frame 203, and a second lead frame 204. The first chip 201 is disposed on the lower surface of the first lead frame 203 and is electrically interconnected thereto by bonding wires 205. The second chip 202 is disposed on the lower surface of the second lead frame 204 and is electrically interconnected thereto by bonding wires 206. The second lead frame 204 is bonded to the first lead frame 203 by a conductive adhesive tape 207 or by the YAG (Yttrium Aluminum Garnet) laser beam The second chip 202 is insulated from the first lead frame 203 by an insulating adhesive film 208. Then, the stacked chip assembly is encapsulated in a resin package 209.

However, in the conventional stacked chip assembly disclosed in U.S. Pat. No. 5,804,874, the corresponding leads of the first lead frame 103 and the second lead frame 104 must be accurately positioned for bonding together in order to prevent electrical shorts therebetween. This makes the stacked chip assembly difficult for manufacturing.

Comparing with the stacked chip assembly of U.S. Pat. No. 5,332,922, the stacked chip assembly of U.S. Pat. No. 5,804,874 has significantly reduced the thickness of the stacked package and the times for bending the leads of the lead frames, thereby simplifying the assembly process therefor. However, the thickness of this package device and the need of using different lead frames in shape for assembly process still fail to meet the future requirements for they semiconductor industry.

Accordingly, the present invention is intended to provide a stacked chip assembly which reduces the thickness thereof and is manufactured with more simplified assembly process.

SUMMARY OF THE INVENTION

It is a primary object of the present invention to provide a stacked chip assembly with a significantly reduced thickness.

It is another object of the present invention to provide a stacked chip assembly of which the manufacturing process is more simplified.

The stacked chip assembly in accordance with the invention generally includes a first chip, a second chip and a lead frame. The lower surface of the first chip and the lower surface of the second chip are pasted together by an adhesive film so as to form a stacked chip body whereby the upper surface of the first chip becomes the upper surface of the stacked chip body and the upper surface of the second chip becomes the lower surface of the stacked chip body. The stacked chip body is disposed on the lead frame. Bonding pads of the upper surface of the first chip are interconnected to the upper surface of the inner leads of the lead frame by bonding wires. Bonding pads of the upper surface of the second chip are interconnected to the lower surface of the inner leads of the lead frame by bonding wires. Therefore, the first chip and the second chip are simultaneously interconnected to an external circuit devices through the outer leads of the lead frame. The stacked chip assembly is encapsulated in an resin package.

The present invention overcomes the disadvantages of the conventional stacked chip assembly. Firstly, since the first chip -and the second chip are pasted together to form a stacked chip body, the thickness of the stacked chip assembly is significantly reduced. Secondly, both the first chip and the second chip are electrically interconnected to the same lead frame, therefore, there is no need of using different lead frames and the assembly process is simplified. On the other hand, in the conventional stacked chip assembly, the first chip and the second chip must be spaced apart enough to prevent electrical short thereby increasing thickness of the stacked chip assembly. Moreover, because the corresponding inner leads of the first lead frame 103 and the second lead frame 104 must be aligned accurately and then bonded by using a YAG laser beam, this increases the manufacturing cost and difficulty.

Other objects, advantages, and novel features of the invention will become more apparent from the following detailed description when taken in conjunction with the accompanying drawings.

DETAILED DESCRIPTION OF THE PREFERRED EMBODIMENT

The present invention includes a stacked chip body which is formed by applying an adhesive film between the lower surface of a first chip and the lower surface of a second chip for pasting the first and second chips together. Then the stacked chip body is disposed on a lead frame wherein the inner leads thereof are provided with a down set region for receiving the stacked chip body. The first chip is interconnected to the upper surface of the inner leads of the lead frame by bonding wires. The second chip are interconnected to the lower surface of the inner leads of the lead frame by bonding wires.

Figure 1:
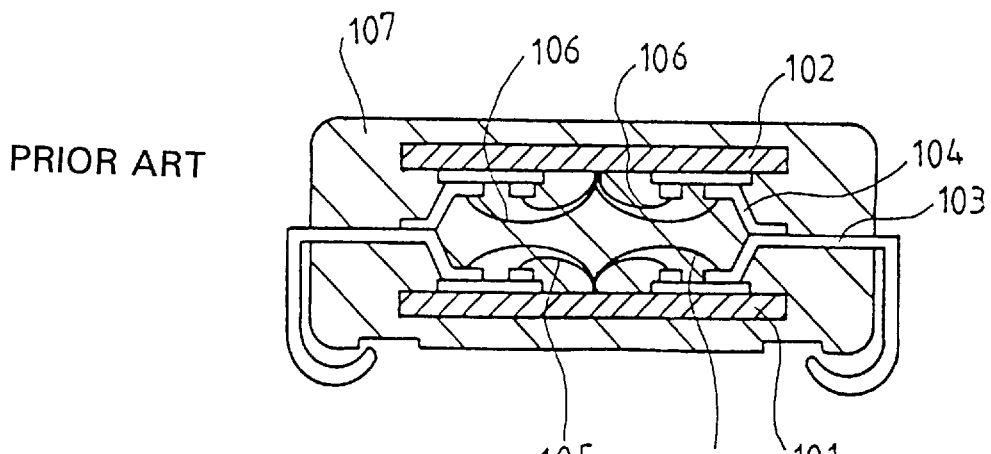
FIG. 1 is a cross sectional view of the stacked chip assembly disclosed in U.S. Pat. No. 5,804,874 the package device of U.S. Pat. No. 5,804,874.
Figure 2:
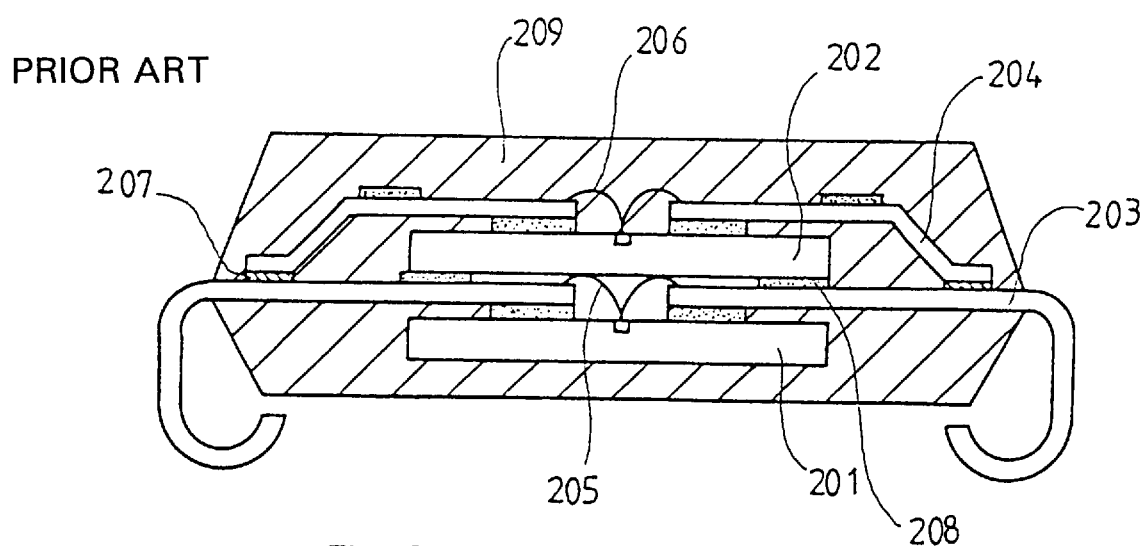
FIG. 2 is a cross sectional view of the stacked chip assembly disclosed in U.S. Pat. No. 5,804,874.
Figure 3:
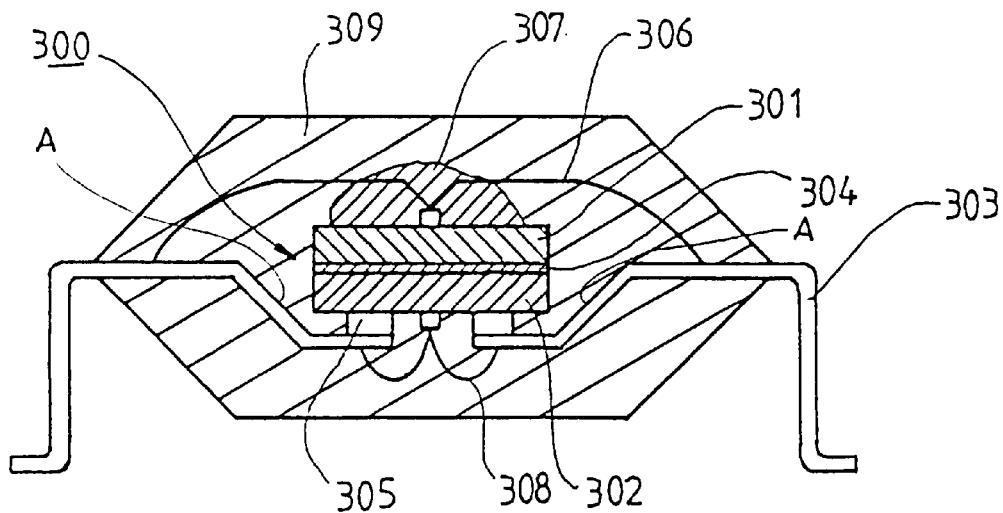
FIG. 3 is a cross sectional view of a first embodiment in accordance with the present invention.

FIG. 3 is a cross sectional view of a first embodiment in accordance with the present invention generally including a first chip 301, a second chip 302 and a lead frame 303. The lower surface of the first chip 301 and the lower surface of the second chip 302 are pasted together by an adhesive film 304 so as to form a stacked chip body 300 whereby the upper surface of the first chip 301 becomes the upper surface of the stacked chip body 300 and the upper surface of the second chip 302 becomes the lower surface of the stacked chip body 300. The stacked chip body 300 is disposed on the lead frame 303 wherein the inner leads thereof are provided with a down set region A for receiving the stacked chip body 300. An insulating adhesive film 305 is disposed between the lower surface of the stacked chip body 300 and the lead frame 303 to affix the stacked chip body 300 to the lead frame 303 such that a stacked chip assembly is formed. First, bonding pads (not shown) of the upper surface of the second chip 302 are interconnected to the lower surface of the inner leads of the lead frame 303 by bonding wires 308. Then the stacked chip assembly is inverted, and bonding pads (not shown) of the upper surface of the first chip 301 are interconnected to the upper surface of the inner leads of the lead frame by bonding wires 306. Therefore, through the bonding wires 306, 308, the first chip 301 and the second chip 302 can be simultaneously interconnected to an external circuit devices by way of the lead frame 303. Moreover, an fixing portion 307 is preferably provided on the upper surface of the first chip 301 by dispensing epoxy material for immobilizing the bonding wires 306 for preventing the bonding wires 306 from sweeping during the encapsulating process. The fixing portion 307 is preferably made of epoxy material with low density thereby accelerating the solidification of the fixing portion 307 such that the processing time can be shortened. The stacked chip assembly in accordance with the first embodiment of the present invention is encapsulated in an resin package 309. Because the thickness of the stacked chip body 300 is reduced, the dimension of the resin package 309 is also reduced such that the heat generated by the stacked chip body 300 can be rapidly transmitted to the outer surface of the resin package body 309. Therefore, the first embodiment in accordance with the present invention has the advantages of reduced thickness and enhanced heat-dissipating efficiency.

Figure 4:
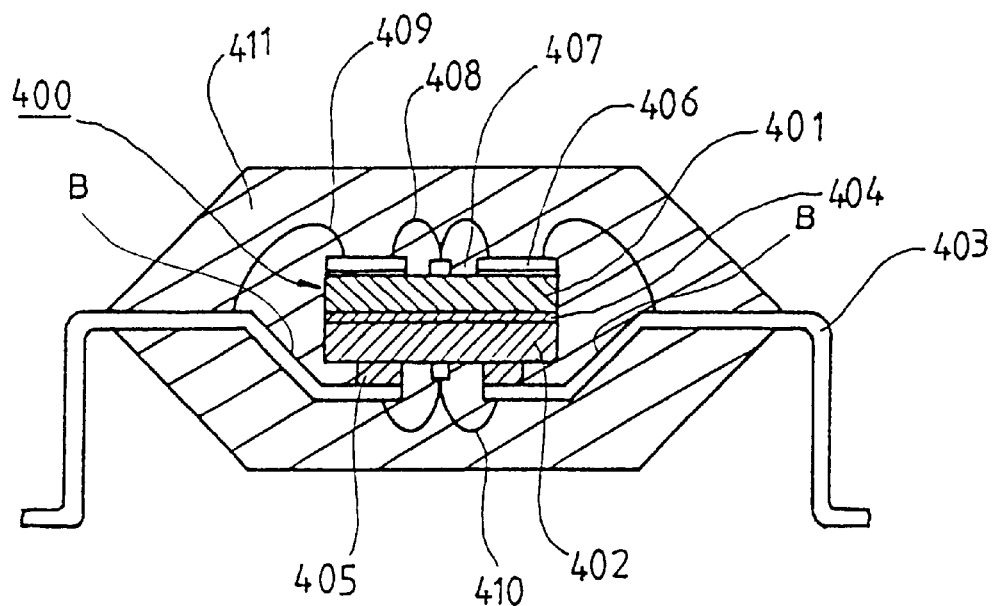
FIG. 4 is a cross sectional view of a second embodiment in accordance with the present invention.

FIG. 4 is a cross sectional view of a second embodiment in accordance with the present invention generally including a first chip 401, a second chip 402 and a lead frame 403. The lower surface of the first chip 401 is pasted onto the lower surface of the second chip 402 by an adhesive film 404. A substrate 406 is pasted onto the upper surface of the first chip 401 by an adhesive film (not shown) and the substrate 406 is provided with a hole 407 defined therein, a circuit layout (not shown), and bonding pads (not shown) interconnected to the circuit layout. The bonding pads of the first chip locate within the hole 407. The first chip 401, the second chip 402, the adhesive film 404 and the substrate 406 are assembled together to form a stacked chip body 400 wherein the upper surface of the substrate 406 becomes part of the upper surface of the stacked chip body 400, bonding pads (not shown) of the first chip 401 is disposed within the hole 407 of the substrate 406, and the upper surface of the second chip 402 becomes the lower surface of the stacked chip body 400. The stacked chip body 400 is disposed on the lead frame 403 wherein the inner leads thereof are provided with a down set region B for receiving the stacked chip body 400. An insulating adhesive film 405 is disposed between the lower surface of the stacked chip body 400 and the lead frame 403 to affix the stacked chip body 400 to the lead frame 403 such that a stacked chip assembly is formed. First, bonding pads (not shown) of the upper surface of the second chip 402 are interconnected to the lower surface of the inner leads of the lead frame 403 by bonding wires 410. Then the stacked chip assembly is inverted, and bonding pads (not shown) of the upper surface of the first chip 401 are interconnected to bonding pads (not shown) around the hole 407 of the substrate 406 by bonding wires 408. And then the bonding pads (not shown) located on the lateral of the substrate 406 are interconnected to the upper surface of the inner leads of the lead frame 403 by bonding wires 409. Therefore, through the bonding wires 408, 409, 410, the first chip 401 and the second chip 402 can be simultaneously interconnected to an external circuit devices by way of the lead frame 403. The stacked chip assembly in accordance with the second embodiment of the present invention is encapsulated in an resin package 411.

Figure 5:
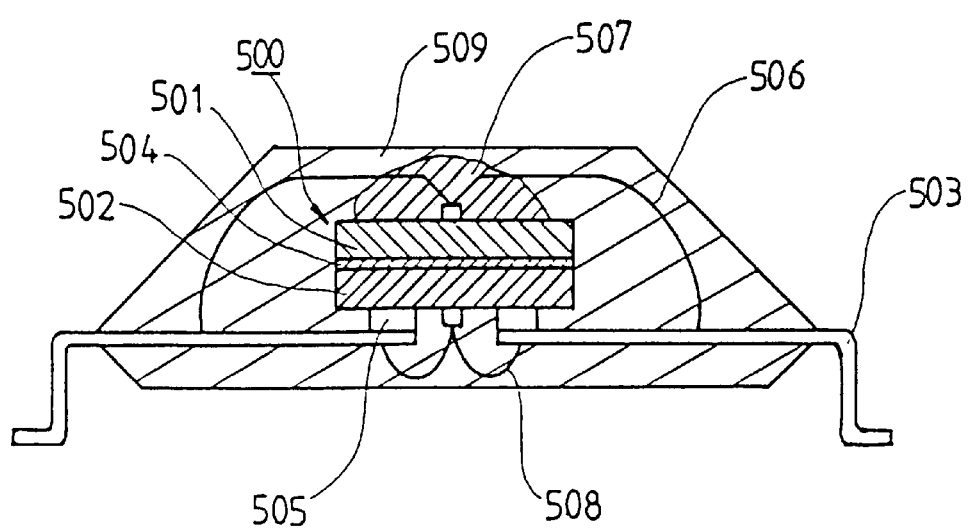
FIG. 5 is a cross sectional view of a third embodiment in accordance with the present invention.

FIG. 5 is a cross sectional view of a third embodiment in accordance with the present invention generally including a first chip 501, a second chip 502 and a lead frame 503. The lower surface of the first chip 501 is pasted onto the lower surface of the second chip 502 by an adhesive film 504 so as to form a stacked chip body 500 whereby the upper surface of the first chip 501 becomes the upper surface of the stacked chip body 500 and the upper surface of the second chip 502 becomes the lower surface of the stacked chip body 500. The stacked chip body 500 is disposed on the inner leads of the lead frame 503. An insulating adhesive film 505 is disposed between the lower surface of the stacked chip body 500 and the lead frame 503 to affix the stacked chip body 500 to the lead frame 503 such that a stacked chip assembly is formed. First, bonding pads (not shown) of the upper surface of the second chip 502 are interconnected to the lower surface of the inner leads of the lead frame 503 by bonding wires 508. Then the stacked chip assembly is inverted, and bonding pads (not shown) of the upper surface of the first chip 501 are interconnected to the upper surface of the inner leads of the lead frame 503 by bonding wires 506. Therefore, through the bonding wires 506, 508, the first chip 501 and the second chip 502 can be simultaneously interconnected to an external circuit devices by way of the lead frame 503. Moreover, an fixing portion 507 is preferably provided on the upper surface of the first chip 501 by dispensing epoxy material for immobilizing the bonding wires 506 for preventing the bonding wires 506 from sweeping during the encapsulating process. The fixing portion 507 is preferably made of epoxy material with low density thereby accelerating the solidification of the fixing portion 507 such that the processing time can be shortened. The stacked chip assembly in accordance with the third embodiment of the present invention is encapsulated in an resin package 509. Because the thickness of the stacked chip body 500 is reduced, the dimension of the resin package body 509 can be reduced such that the heat generated by the stacked chip body 500 can be rapidly transmitted to the outer surface of the resin package body 509. Therefore, the third embodiment in accordance with the present invention has the advantages of reduced thickness and enhanced heat-dissipating efficiency.

Referring to the FIGS. 1 to 5, the stacked chip assembly of U.S. Pat. No. 5,332,922 and U.S. Pat. No. 5,804,874 are compared with the stacked chip assembly in accordance with the present invention as follows. The stacked chip assemblies of U.S. Pat. No. 5,332,922 and U.S. Pat. No. 5,804,874 employ the LOC technology for interconnecting the first chip 101, 201 and the second chip 201, 202 respectively to the first lead frame 103, 203 and the second lead frame 104, 204 by wire bonding, and then the first lead frame 103, 203 and the second lead frame 104, 204 are stacked together wherein the corresponding inner leads of the first lead frame 103, 203 and the second lead frame 104, 204 must be aligned accurately to avoid electrical shorts therebetween. Accordingly, there is a disadvantage of more complicated manufacturing process for these conventional art. According to the stacked chip assembly of U.S. Pat. No. 5,332,922, the first lead frame 103 and the second lead frame 104 are interposed between the first chip 101 and the second chip 102, whereby the thickness thereof cannot be significantly reduced. The stacked chip assembly of U.S. Pat. No. 5,332,922 is composed of the first chip 201, the first lead frame 203, the second chip 202 and the second lead frame 204 stacked together, whereby the thickness thereof cannot be significantly reduced, either. On the other hand, the stacked chip assembly in accordance with the present invention is composed of the single lead frame 303, 403, 503 for receiving the stacked chip body 300, 400, 500 consisting of the first chip 301, 401, 501 and the second chip 302, 402, 502 adhered to each other. The thickness thereof is contributed only by the lead frame 303, 403, 503, the first chip 301, 401, 501 and the second chip 302, 402, 502 whereby the thickness thereof can be significantly reduced. Moreover, the stacked chip body 300, 400, 500 can invert in accordance with the requirement of the wire bonding on the upper or lower surface thereof, thereby resulting in a simplified manufacturing process.

Although the invention has been explained in relation to its preferred embodiments, it is to be understood that many other possible modifications and variations can be made without departing from the spirit and scope of the invention as hereinafter claimed.

What is claimed is:

1. A stacked chip assembly comprising:

a first chip having a first upper surface, a first lower surface, and first bonding pads disposed on the first upper surface of the first chip;

a substrate having a hole defined therein, second bonding pads, and a circuit layout, the substrate being pasted onto the first upper surface of the first chip in a manner that the first bonding pads of the first chip are located within the hole of the substrate;

a second chip disposed on the first upper surface of the first chip, the second chip having a second upper surface, a second lower surface, and third bonding pads, the second lower surface of the second chip being pasted onto the first lower surface of the first chip to form a stacked chip body such that the substrate is disposed on the upper surface of the stacked chip body and the second upper surface of the second chip becomes the lower surface of the stacked chip body;

a lead frame having inner leads and an insulating layer for carrying the stacked chip body;

first bonding wires for electrical interconnecting the first chip to the substrate;

second bonding wires for electrical interconnecting the substrate to the inner leads;

third bonding wires for electrical interconnecting the second chip to the inner leads, whereby the first chip and the second chip are simultaneously interconnected to an external circuit devices through the lead frame.

2. The stacked chip assembly as claimed in claim 1, wherein the inner leads of the lead frame are provided with a down set region for carrying the stacked chip body, the substrate is interconnected to the upper surface of the inner leads of the lead frame by the second bonding wires, and the second chip is interconnected to the lower surface of the inner leads of the lead frame by the third bonding wires.

3. The stacked chip assembly as claimed in claim 1, further comprising an adhesive film interposed between the second chip and the first chip.

\* \* \* \* \*